(12) United States Patent
Sugimura et al.

(10) Patent No.: US 7,168,004 B2
(45) Date of Patent: Jan. 23, 2007

(54) TECHNIQUE FOR TESTABILITY OF SEMICONDUCTOR INTEGRATED CIRCUIT

(75) Inventors: Yukio Sugimura, Osaka (JP); Jun Ogawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 548 days.

(21) Appl. No.: 10/663,993

(22) Filed: Sep. 17, 2003

(65) Prior Publication Data

US 2004/0153806 A1 Aug. 5, 2004

(30) Foreign Application Priority Data

Sep. 17, 2002 (JP) .......................... P2002-270069

(51) Int. Cl.
*G06F 11/00* (2006.01)
(52) U.S. Cl. ........................... 714/30; 714/32; 714/726
(58) Field of Classification Search ................. 714/30, 714/32, 726
See application file for complete search history.

(56) References Cited

U.S. PATENT DOCUMENTS

| | | | | |
|---|---|---|---|---|
| 4,742,293 A | * | 5/1988 | Koo et al. | 714/726 |
| 5,291,495 A | * | 3/1994 | Udell, Jr. | 714/726 |
| 5,648,733 A | | 7/1997 | Worrell et al. | |
| 5,657,329 A | | 8/1997 | Sauerwald et al. | |
| 5,717,700 A | | 2/1998 | Crouch et al. | |
| 6,219,812 B1 | * | 4/2001 | Golshan | 714/727 |
| 6,253,343 B1 | * | 6/2001 | Hosokawa et al. | 714/726 |
| 6,415,403 B1 | * | 7/2002 | Huang et al. | 714/726 |
| 6,651,197 B1 | * | 11/2003 | Wildes et al. | 714/726 |
| 6,678,846 B1 | * | 1/2004 | Maeno | 714/726 |
| 6,745,357 B1 | * | 6/2004 | Chrudimsky et al. | 714/726 |
| 6,968,487 B1 | * | 11/2005 | Bryant et al. | 714/726 |
| 7,065,692 B1 | * | 6/2006 | Whetsel | 714/733 |
| 2003/0149925 A1 | * | 8/2003 | Angelotti et al. | 714/726 |

FOREIGN PATENT DOCUMENTS

| | | |
|---|---|---|
| JP | 05-080120 A | 4/1993 |
| JP | 06-230075 A | 8/1994 |

* cited by examiner

*Primary Examiner*—Scott Baderman
*Assistant Examiner*—Joshua Lohn
(74) *Attorney, Agent, or Firm*—McDermott Will & Emery LLP

(57) ABSTRACT

A technique for testability of a semiconductor integrated circuit is disclosed. In a first step, a fault simulation is conducted based on a predetermined test pattern to discriminate detectable faults and undetectable faults from each other. In a second step, undetected faults are listed. In a third step, the test conditions for the undetected faults are determined. In a fourth step, a test pattern most likely to meet the test conditions is selected from among a plurality of test patterns. In a fifth step, the registers associated with the undetected faults are replaced with scan registers, while at the same time connecting the scan registers in a scan chain to thereby make up a modified circuit. In a sixth step, a fault simulation is conducted by switching to the test condition at the timing corresponding to the undetected faults using the test pattern for the modified circuit.

5 Claims, 12 Drawing Sheets

TECHNIQUE FOR TESTABILITY OF SEMICONDUCTOR INTEGRATED CIRCUIT

BACKGROUND OF THE INVENTION

The present invention relates to a technique for testability of a semiconductor integrated circuit.

FIG. 12 shows a configuration for the conventional method of testing a semiconductor integrated circuit. In FIG. 12, reference numeral 0201 designates a chip, numeral 0202 an internal memory (RAM: random access memory), numeral 0203 a CPU (central processing unit), numeral 0204 a circuit to be tested, numeral 0205 internal buses for connecting the aforementioned component parts to each other, numeral 0206 a scan test circuit connected to the internal buses 0205 and the circuit to be tested 0204, numeral 0206a signal lines for connecting the scan-test related terminals of the circuit to be tested 0204 to the scan test circuit 0206, and numeral 0207 an external bus IF (interface) unit for connecting the internal buses 0205 to input-output terminals 0208.

When testing the circuit under test 0204, the scan test circuit 0206 is controlled through the buses 0205 from the CPU 0203 or the input-output terminals 0208. The test data are set and input to the scan-test related terminals of the circuit to be tested 0204. Then, the value of the scan-test related terminals of the circuit to be tested 0204 is read out.

This method of testing the integrated circuit is called a full scan test method. The method is based on the following facts. All the registers in the circuit to be tested 0204 are replaced by scan registers and connected in a scan chain. As a result, the registers that can be controlled or observed directly from the buses are also replaced by scan registers. The scan register, however, occupies a larger area than the ordinary register. As a result, a large chip size is required to replace all the registers with scan registers.

Also, at the time of the scan test, a scan clock for the scan test is input to the circuit to be tested 0204 from the scan test circuit 0206 in addition to the clock for normal operation. The test clock is generated and output by controlling the scan test circuit 0206 through the buses 0205 from the CPU 0203 or the input-output terminals 0208. Normally, however, the bus speed is lower than the speed of the internal clock. Therefore, the test cannot be conducted at the same speed as the normal operation.

SUMMARY OF THE INVENTION

Accordingly, the primary object of the invention is to attain a high-speed operation while at the same time reducing the wasteful chip area.

In order to achieve this object, according to this invention, the following means are included. Specifically, a technique for testability of a semiconductor integrated circuit comprises a plurality of steps described below.

In a first step, detectable faults and undetectable faults are discriminated from each other by a fault simulation conducted for a semiconductor integrated circuit based on a predetermined test pattern.

In a second step, the undetectable faults are listed.

In a third step, the test conditions are determined for testing the undetected faults.

In a fourth step, a test pattern most likely to meet the test conditions in the third step is determined from predetermined test patterns for the fault simulation in the first step.

In a fifth step, the registers associated with the undetected faults in the second step are replaced by scan registers, which are connected in a scan chain to thereby make up a modified circuit.

In a sixth step, the fault simulation is carried out by switching to the test condition determined in the third step at the timing for the undetected fault using the predetermined test pattern determined in the fourth step for the modified circuit.

The operation with this configuration is performed as follows. Specifically, unlike the conventional full scan test method in which all the registers are replaced by scan registers, only those registers associated with the undetected faults are replaced by scan registers. Test data is set and input from an external source to the scan registers on the input side of a combination logic circuit to be tested. On the input side of the combination logic circuit, the rest of the test data are set and input from the integrated circuit terminal or the built-in processor to the registers, which is not the scan register. The rest of test data is set and input to the scan registers from an external source. In this way, part of the test data can be set and input to the registers utilizing a predetermined test pattern prepared for the function verification like that. The rest of test data are set and input to the scan registers from an external source, and the fault simulation and the test is carried out. As compared to the full scan test method, the number of the registers to be replaced with the scan registers can be reduced to the required minimum and the increase in chip area can be effectively suppressed. Also, the whole input-output operation can be controlled and the high-speed processing is enabled by using a predetermined test pattern with the normal basic clock for operating the registers not associated with the faults.

In the technique for testability of the semiconductor integrated circuit described above, the fifth step may be modified as follows. Specifically, a modified circuit may be configured by replacing the input registers associated with the undetected faults with the registers with set function or the registers with reset function instead of the scan registers. In this case, in addition to the effects described above, the registers with set function or the registers with reset function can improve the controllability from the integrated circuit terminals or the built-in processor, thereby enabling more efficient processing.

As another method to achieve the object described above, the present invention employs the following means. Specifically, the technique for testability of the semiconductor integrated circuit comprises a plurality of the following steps.

In a first step, a group of registers connected to a combination logic circuit to be tested in the semiconductor integrated circuit are classified into first registers directly controllable and observable by the processor, second registers directly controllable and observable from the terminal of the semiconductor integrated circuit, and third registers other than the first and second registers. Then, the third registers are replaced with scan registers, which are connected in a scan chain thereby to make up a modified circuit.

In a second step, the test data are set and input to the first and second registers from the processor and the integrated circuit terminal, respectively.

In a third step, the test data are set and input to the third registers with the shift operation through the scan chain.

In a fourth step, the test data are captured for the combination logic circuit.

In a fifth step, the data constituting the test result in the third registers are output with the shift operation through the scan chain.

In a sixth step, the data constituting the test result in the first and second registers are output.

The effects of this configuration are explained below. Specifically, unlike the conventional full scan test method in which all the registers are replaced with scan registers, only the third registers that cannot be controlled or observed directly from the processor and the third registers that cannot be controlled or observed directly from the integrated circuit terminal are replaced with scan registers. Also, in the fault simulation and the test, the normal test data are set and input to the first and second registers, while the test data are set and input to the third registers with the shift operation through the scan chain. With regard to the test result data to be observed, the third registers output the data with the shift operation using the scan chain, while the test result data are read from the first and second registers using the processor or the terminal. By doing so, as compared to the full scan test method, the number of registers to be replaced with the scan registers can be reduced to thereby suppress an increase in chip area.

The foregoing and other aspects will become apparent from the following description of the invention when considered in conjunction with the accompanying drawing.

BRIEF DESCRIPTION OF THE DRAWINGS

In all these drawings, like components are indicated by the same numerals, respectively.

DETAILED DESCRIPTION OF THE INVENTION

The technique for testability of a semiconductor integrated circuit according to a preferred embodiment of the invention is explained in detail below with reference to the accompanying drawings.

(Embodiment 1)

Figure 1:
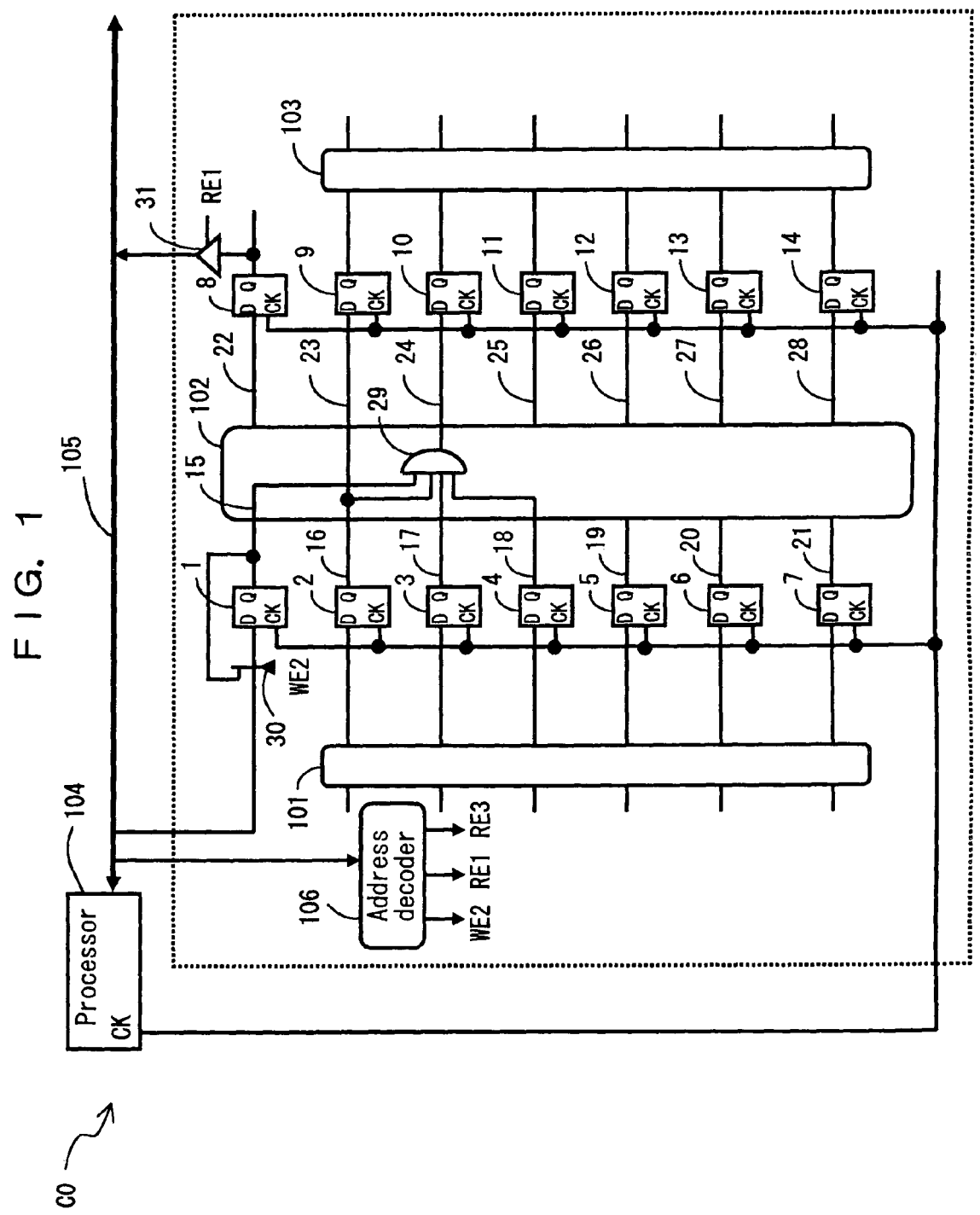
FIG. 1 is a circuit diagram showing an original circuit not designed for testability according to first to third embodiments of the invention.

FIG. 1 shows an original circuit CO before being modified by the design for testability in accordance with the present invention. In the logic circuit design stage, the circuit correction for testability, i.e. the design for testability of the original circuit CO is carried out.

In FIG. 1, reference numerals 101, 102 and 103 designate a combination logic circuit of which the output is uniquely determined upon determination of an input. The combination logic circuit does not include a register, a latch or a memory therein. In the current example, the combination logic circuit 102 is an object of test. For simplifying the explanation, the combination logic circuit includes only one AND circuit 29. Numeral 104 designates a processor mounted on the semiconductor integrated circuit, numeral 105 a bus connecting the processor 104 and each part, and numeral 106 an address decoder. The address decoder 106 decodes the address portion of the bus 105 and generates and outputs a write enable signal WE2 and read enable signals RE1 and RE3.

Numerals 1 to 14 designate registers each including a D-flip-flop.

The register 1 can control the write operation from the processor 104. The register 1 is so configured as to fetch in the value of the data portion of the bus 105 through a selector 30 by the write enable signal WE2 from the address decoder 106.

The register 8 can control the data read operation from the processor 104. The register 8 outputs a value to the data portion of the bus 105 through a tri-state buffer (read enable circuit) 31 by the read enable signal RE1 from the address decoder 106.

The processor 104 can read the value output to the data portion of the bus 105. Character CK designates a basic clock used for the combination logic circuit and supplied from the processor 104.

Figure 2:
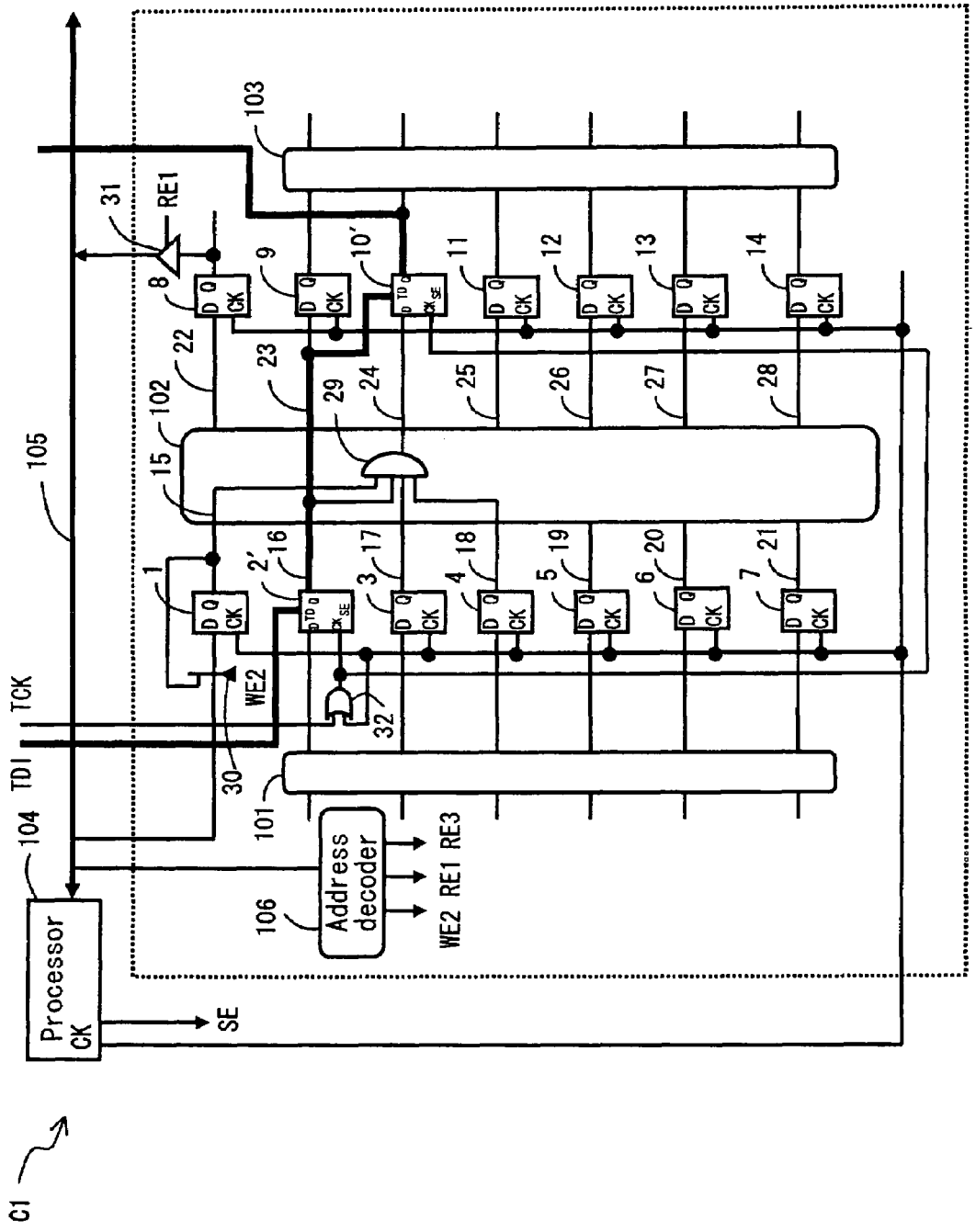
FIG. 2 is a circuit diagram showing a circuit modified for testability from the original circuit according to a first embodiment of the invention.

FIG. 2 shows a modified circuit C1 after correction for testability of the original circuit CO not designed for testability. In the modified circuit C1, the registers 2 and 10 in the original circuit CO are replaced by a scan register 2' and a scan register 10', respectively (by a replacement method described later with reference to FIGS. 4 and 5). The scan registers 2', 10' make up a scan chain.

Figure 3B:
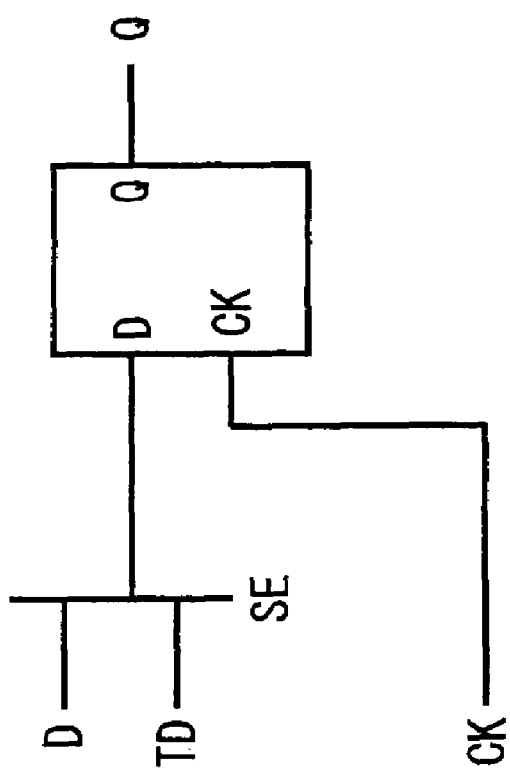
FIG. 3B is a circuit diagram showing an equivalent circuit thereof.
Figure 3A:
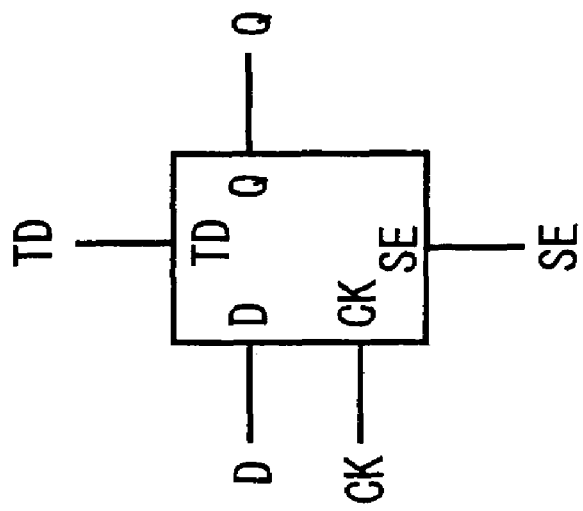
FIG. 3A is a diagram showing the configuration of a scan register used in the modified circuit according to the first embodiment.

FIG. 3A shows a configuration of the scan register used for the modified circuit C1 in FIG. 2. FIG. 3B shows an equivalent circuit. This scan register, in addition to the data input (D) for normal operation, has a scan test data input (TD), and further a scan enable input (SE). In the scan register, as long as the scan enable input (SE) remains "0", the value of the data input (D) is fetched in at the rise timing of the clock input (CK). As long as the scan enable input (SE) is "1", on the other hand, the value of the test data input (TD) is fetched in at the rise timing of the clock input (CK).

In FIG. 2, character TDI (test data input) designates a data input terminal for the scan chain including the scan registers 2' and 10'. Character TDO (test data output) designates a data output terminal for the scan chain including the scan registers 2' and 10'. Character TCK designates a test clock input terminal. The data are fetched in from the test data input terminal TDI, shifted in the scan chain, and the data obtained through the combination logic circuit 102 are output to the test data output terminal TDO. In this operation, the test clock from the test clock input terminal TCK controls the timing.

Numeral 32 designates an OR circuit. The OR circuit 32 has two inputs including a test clock from the external test clock input terminal TCK and a basic clock CK from the processor 104. The output of the OR circuit 32 is connected to the clock input (CK) of the scan registers 2' and 10' making up the scan chain.

In the modified circuit C1, the scan chain is configured of the scan registers 2' and 10' with which the registers are replaced and the test data input terminal TDI and the test data output terminal TDO connected thereto. When testing the scan chain, the processor 104 stops the output of the basic clock CK while at the same time switching the scan enable signal SE to active state "1". This scan enable signal SE is applied to the scan enable input terminals (SE) of the scan registers 2' and 10', respectively. As a result, the scan registers 2' and 10' switch the data input terminal from the data input (D) for normal operation to the test data input (TD). The test clock from the external test clock input terminal TCK is supplied to the clock input (CK) of the scan registers 2' and 10' through the OR circuit 32. As a result, an arbitrary test data can be input to the test data input terminal (TD) of the scan register 2' from the external test data input terminal TDI. The data output from the data output (Q) of the scan register 2' is logically synthesized by the combination logic circuit 102. The result of the logic synthesis is input to the data input terminal (D) of the scan register 10', and from the data output (Q) of the scan register 10', output to the external test data output terminal TDO. In other words, the logic synthesis by the combination logic circuit 102 can be observed.

Figure 4:
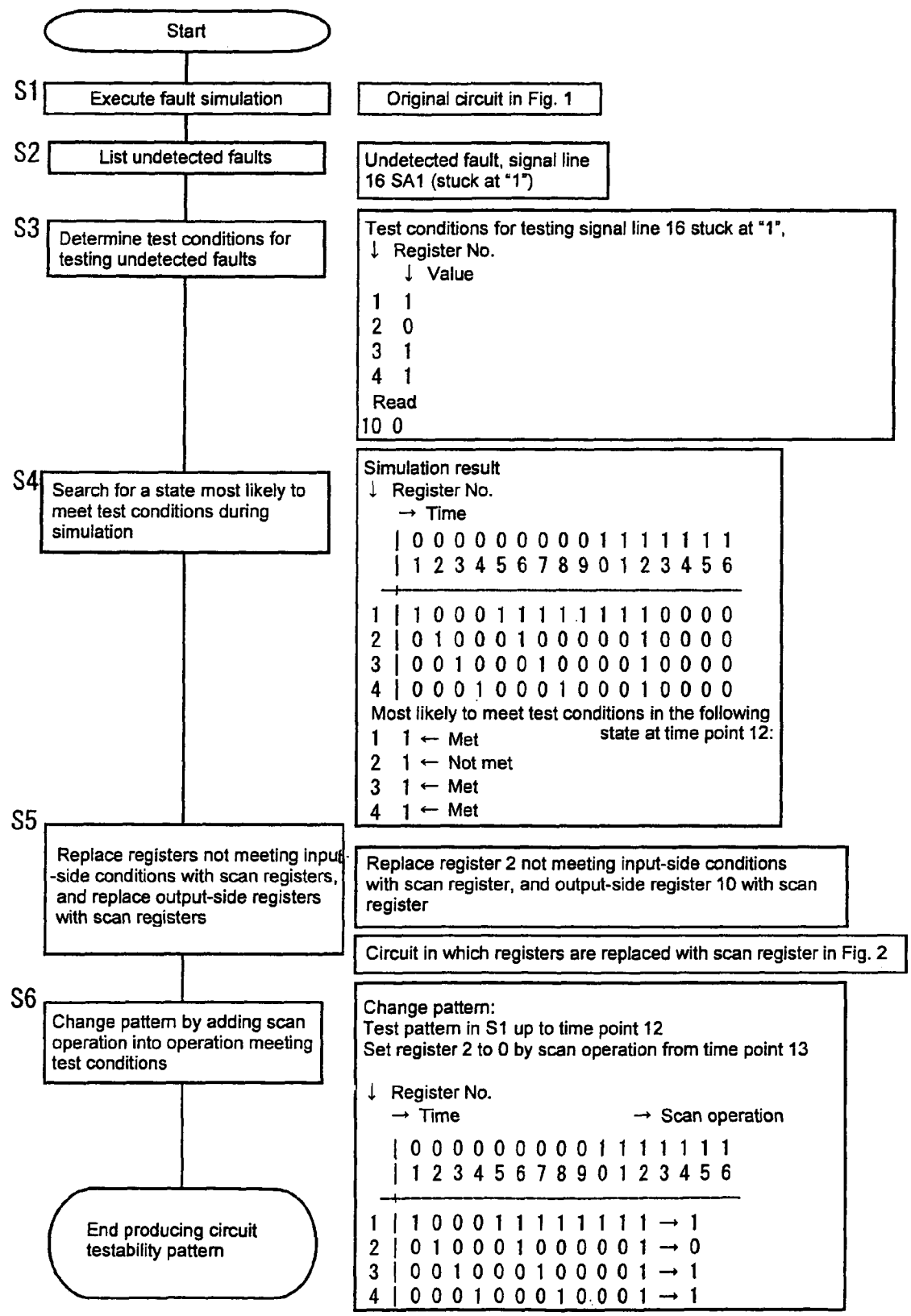
FIG. 4 is a flowchart showing the test operation including the production of a modified circuit and the production of a test pattern according to the first embodiment.

FIG. 4 is a flowchart showing the test operation conducted by correcting the original C0 of FIG. 1 into the modified circuit C1 of FIG. 2 while at the same time producing a test pattern for the modified circuit C1.

Assume that a test pattern already exists for the original circuit C0. In order to improve the fault detection rate, the design for testability is carried out and a test pattern is added. The fault detection rate is the ratio in percent by which the faults detected by a given test pattern represent of all the faults. The fault detection rate is an index of the completeness of the test pattern.

First, in step S1, the fault simulation is conducted with the original circuit CO. The fault simulation is a process of the design, or especially, the test design conducted in relation to a test. In the fault simulation, detectable and undetectable faults are checked by a given test pattern series. The fault simulation is carried out by applying an already produced test pattern to the original circuit C0.

Next, in step S2, the faults not detected in the fault simulation are listed. The fault undetected in the fault simulation is defined as a fault of a given portion which cannot be found or detected with the test pattern used in the fault simulation. In the current case, assume that a fault, in which the output signal line 16 of the register 2 of the original circuit CO is stuck at "1" (hereinafter referred to as "SA1"), is not yet detected. The stuck-at fault is defined as the fact that the logic value is fixed to "0" or "1".

Next, in step S3, the conditions (test conditions) for testing an undetected fault [signal line 16: SA1] are determined. In order to detect an undetected fault [signal line 16: SA1], a test is conducted in such a manner that the value observed as an expectation is changed by the occurrence of a fault of the signal line 16 stuck at "1". The test conditions on input side for this purpose are as follows:

Output signal line 15 of register 1 "1"
Output signal line 16 of register 2 "0"
Output signal line 17 of register 3 "1"
Output signal line 18 of register 4 "1"

Unless the fault [signal line 16: SA1] occurs under these conditions, the output signal line 24 of the AND circuit 29 turns to "0", while if the fault [signal line 16: SA1] occurs, on the other hand, the output signal line 24 of the AND circuit 29 turns to "1".

Next, in step S4, a state most likely to meet the test conditions during the execution of the fault simulation is searched for to produce a test pattern. In the current case, assume that the state at time point T12 shown below is most likely to satisfy the test conditions.

Output signal line 15 of register 1 "1"
Output signal line 16 of register 2 "1"
Output signal line 17 of register 3 "1"
Output signal line 18 of register 4 "1"

Next, the original circuit C0 is modified in order to easily produce the test pattern.

Specifically, in step S5, a register, which is in a state most likely to satisfy the test conditions and fails to satisfy the conditions, is replaced with a scan register. In the current case, the register 2 is replaced with the scan register 2'. Also, a register, to which a signal with the output/expectation changing depending on whether a fault occurs or not is set and input, is replaced with a scan register. In the current case, the register 10 is replaced with a register 10'.

At the same time, the test data input terminal TDI for setting and inputting the scan test data is added. Also, the test data output terminal TDO for observing the scan data is added. Further, the test clock input terminal TCK for inputting the test clock used for setting/inputting, shifting and outputting the test data is added. Also, in the processor 104, the scan enable signal SE for setting a scan mode is added. The test data input terminal TDI is connected to the test data input terminal (TD) of the scan register 2' in the initial stage of the scan chain. Also, the test data output terminal TDO is connected to the data output (Q) of the scan register 10' in the last stage of the scan chain. Further, the scan enable signal SE is connected to the scan enable input (SE) of the scan registers 2' and 10'. The test clock input terminal TCK is connected to one of the input terminals of the OR circuit 32. The other input terminal of the OR circuit 32 is connected to the basic clock CK of the processor 104. The output of the OR circuit 32 is connected to the clock input (CK) of the scan registers 2' and 10'. The data output (Q) of the scan register 2' is connected to the test data input terminal (TD) of the scan register 10'.

In the current case, only one undetected fault exists, and therefore the original circuit CO shown in FIG. 1 is modified to the modified circuit C1 shown in FIG. 2. Alternatively, in the case where a plurality of undetected faults exist, the registers as many as the undetected faults are repeatedly replaced with scan registers.

Next, in step S6, a test pattern for detecting an undetected fault [signal line 16: SA1] in the modified circuit C1 shown in FIG. 2 is produced. Up to time point T12 when the state most likely to satisfy the test conditions occurs, the test pattern used for the fault simulation in step S1 is used (as described in detail later with reference to FIG. 5). With this test pattern, the following conditions prevail at time point T12:

Output signal line 15 of register 1 "1"
Output signal line 16 of register 2 "1"
Output signal line 17 of register 3 "1"
Output signal line 18 of register 4 "1"

From this state, a test pattern capable of detecting the undetected fault [signal line 16: SA1] is produced by activating the scan chain. In the current case, the test pattern produced is as follows:

Output signal line 15 of register 1 "1"
Output signal line 16 of register 2 "0"
Output signal line 17 of register 3 "1"
Output signal line 18 of register 4 "1"

In the case where there are a plurality of faults, this pattern is produced repeatedly.

Figure 5:
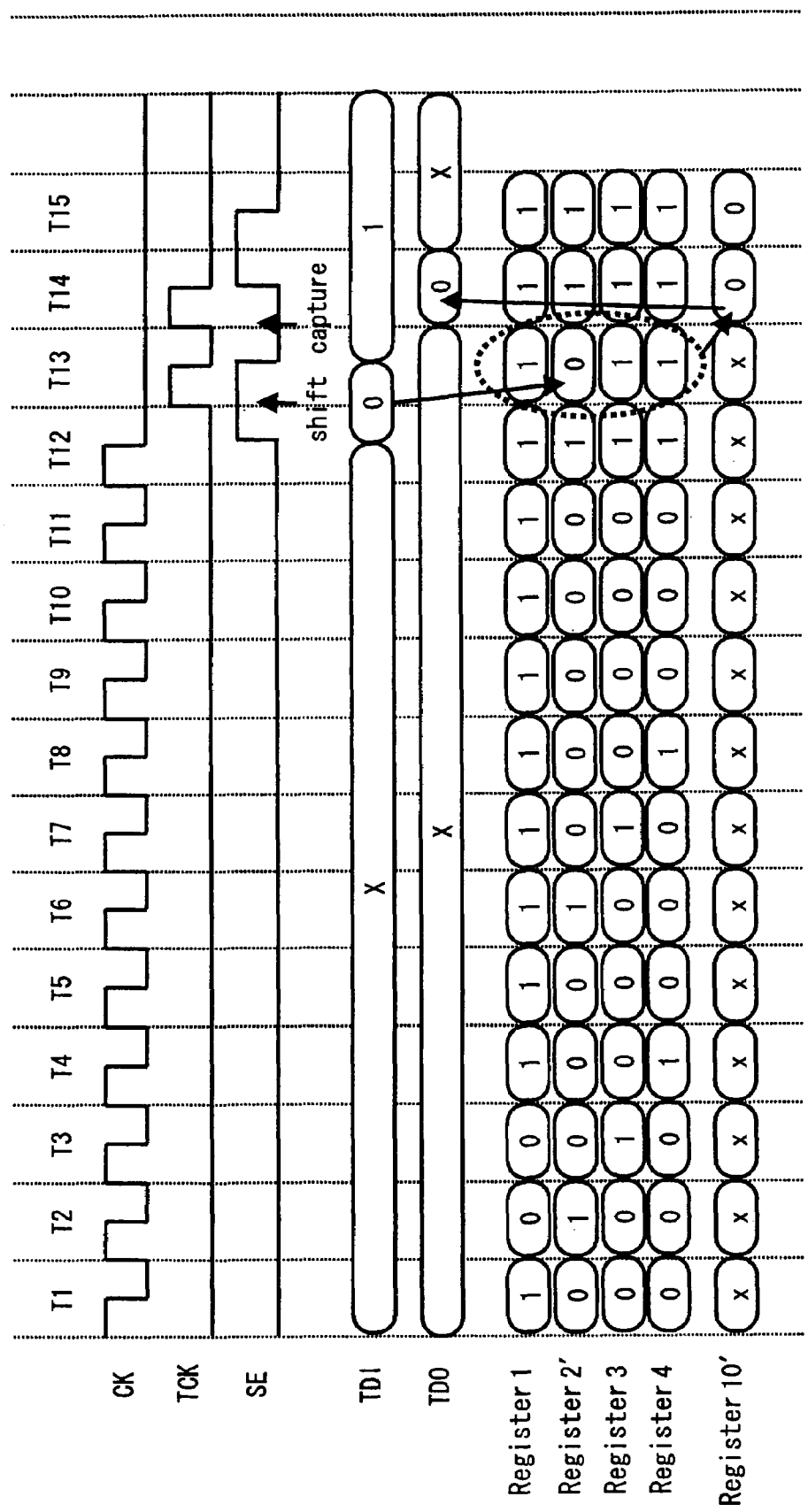
FIG. 5 is a time chart for explaining the operation of the modified circuit according to the first embodiment.

FIG. 5 is a time chart for explaining the operation of the modified circuit C1 shown in FIG. 2. The waveforms of the basic clock CK, the test clock input terminal TCK, the scan enable signal SE, the test data input terminal TDI and the test data output terminal TDO and the values held by the registers 1 to 4 and 10 are shown.

The fault simulation is carried out in the normal operation mode, which is not the scan operation from time point T1 to T12. During the time period from time point T1 to T12, the test clock input terminal TCK is "0". Also, the scan enable signal SE is "0". The registers 1 to 4 (of which 2' indicates a scan register) and the scan register 10' change in value in the same manner as the fault simulation.

At the time point T12, the registers 1 to 4 assume a state most likely to satisfy the test conditions in the test design flow shown in FIG. 4. Once this state is reached, the scan register 2' is switched to the scan operation mode temporarily. The test conditions are produced by rewriting the value of the scan register 2' as the result of the scan operation. From the last half of the time point T12, the basic clock CK is set to "0", the scan enable signal SE to "1", and the test data input terminal TDI to the data "0" which is set and input to the scan register 2'.

At the start of time point T13, the test clock input terminal TCK is activated, so that the data "0" of the test data input terminal TDI is fetched into the scan register 2'. This state fully satisfies the test conditions. The test pattern thus produced is as follows:

Output signal line 15 of register 1 "1"
Output signal line 16 of register 2' "0"
Output signal line 17 of register 3 "1"
Output signal line 18 of register 4 "1"

In order to fetch the output of the AND circuit 29 into the scan register 10' under the test conditions, the scan enable signal SE is set to "0" from the last half of the time point T13.

At the start of time point T14, the test clock input terminal TCK is activated and the output of the AND circuit 29 is fetched into the scan register 10'. In the current case, the scan register 10' holds the value "0" and this value of the scan register 10' is output to the test data output terminal TDO at the time point T14. By comparing the value at the test data output terminal TDO to the expectation data "0" at the time point T14, the undetected fault [signal line 16: SA1] can be detected. In the current case, there is one undetected fault, and therefore the required test is completed.

In the case where a plurality of undetected faults exist, as many tests as the undetected faults are repeatedly conducted.

This embodiment represents a partial scan test in which only the required registers are replaced with scan registers. Unlike the full scan test in which all the registers are replaced with scan registers, therefore, the chip area is increased to a lesser degree.

In the full scan test, the registers making up the scan chain are increased in number, and a lengthened chain causes an inconvenience. Specifically, many data are required to be set and input by way of the test data input terminal TDI for setting and inputting the test conditions, thereby consuming a long time. Also, a considerably long time is taken to read the result from the test data output terminal TDO.

According to this embodiment, in contrast, the test conditions are produced utilizing the normal operating condition (the operating condition of the test pattern in step S1) with the registers operating in parallel. Further, the length of the scan chain is reduced to the required minimum. As a result, the undetected faults can be captured within a shorter test time.

(Embodiment 2)

Figure 6:
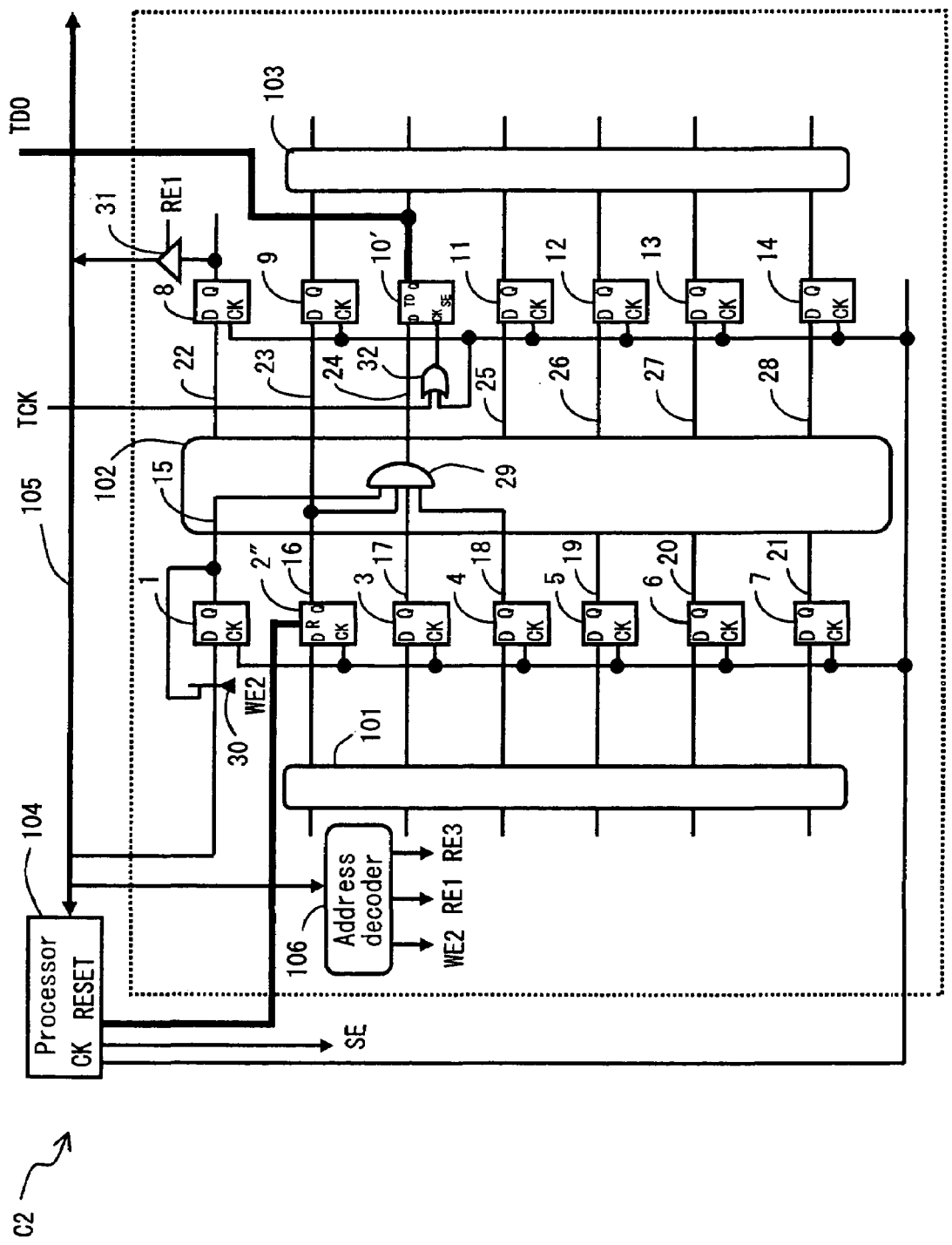
FIG. 6 is a circuit diagram showing a circuit modified from the original circuit for testability according to a second embodiment of the invention.

FIG. 6 shows a circuit C2 modified in testability from the original circuit C0 of FIG. 1 not designed for testability. As shown in the modified circuit C2, the register 2 of the original circuit C0 is replaced with a register 2" with reset function. Also, the register 10 is replaced with a scan register 10'.

Specifically, in FIG. 1, the register 2, the value of which is considered difficult to set to "0" even under the control of the processor 104, is replaced with the register 2" with reset function in order to be forcibly set and input as "0". "RESET" designates a reset signal for forcible resetting, and in the current case, is output by the processor 104. Nevertheless, the reset signal is not necessarily output by the processor 104. The register 10 shown in FIG. 1, on the other hand, is considered difficult to observe under the control of the processor 104, and therefore replaced with the scan register 10'. The method of replacing the register 2 with the register 2" with reset function and the register 10 with the register 10' is explained later with reference to FIG. 7.

The scan enable signal SE instructs the scan register 10' to fetch in the data from the test data input terminal (TD). The data output (Q) of the scan register 10' is connected to the data output terminal TDO of the scan chain. In the current case, the scan register is limited to the scan register 10', and therefore forms no scan chain. In the presence of a plurality of scan registers, however, a scan chain is formed by connecting the data output (Q) successively to the test data input (TD) of the next scan register. The test clock input terminal TCK is connected to the clock input (CK) of the scan register 10' through the OR circuit 32. Specifically, the OR circuit 32 has two input terminals to receive the basic clock TCK from the processor 104 and the signal from the external test clock input terminal TCK. The output of the OR circuit 32 is connected to the clock input (CK) of the scan register 10'. The test clock from the test clock input terminal TCK shifts the data of the scan chain, and controls the timing of the operation to output the data to the test data output terminal TDO.

Figure 7:
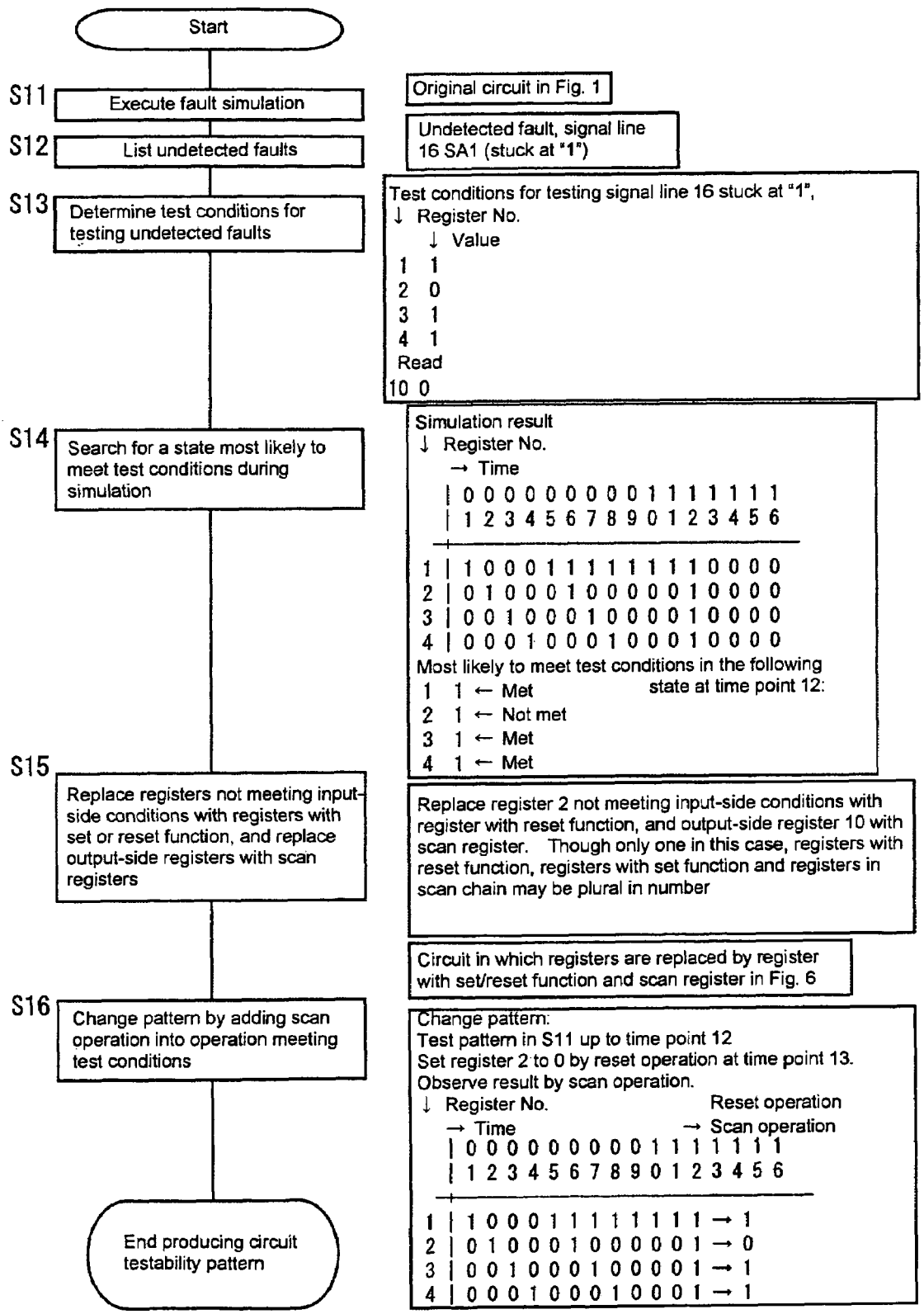
FIG. 7 is a flowchart showing the test operation including the production of a modified circuit and the production of a test pattern according to the second embodiment.

FIG. 7 is a flowchart showing the test operation which is conducted by correcting the original circuit C0 shown in FIG. 1 to the circuit C2 shown in FIG. 6 while at the same time producing a test pattern for the modified circuit C2.

Assume that there already exists a test pattern for the original circuit C0. In order to improve the fault detection rate, the design for testability is conducted and a test pattern is added.

First, the fault simulation is carried out for the original circuit C0 in step S11.

Next, in step S12, the faults not detected in the fault simulation are listed. In the current case, the faults in which the output signal line 16 of the register 2 of the original circuit CO is stuck at "1" are assumed to be undetected.

Next, in step S13, the conditions (test conditions) for detecting an undetected fault [signal line 16: SA1] are determined. The test conditions on input side for detecting the undetected fault [signal line 16: SA1] are determined as in the foregoing case as follows.

Output signal line 15 of register 1 "1"
Output signal line 16 of register 2 "0"
Output signal line 17 of register 3 "1"
Output signal line 18 of register 4 "1"

Under these conditions, in the absence of the fault [signal line 16: SA1], the output signal line 24 of the AND circuit 29 turns to "0", while in the presence of the fault [signal line 16: SA1], the signal line 24 turns to "1".

Next, in step S14, the state most likely to meet the test conditions is searched for during the execution of the fault simulation in order to produce a test pattern. In the current case, the following state at the time point T12 applies.

Output signal line 15 of register 1 "1"
Output signal line 16 of register 2 "1"
Output signal line 17 of register 3 "1"
Output signal line 18 of register 4 "1"

Next, the original circuit CO is modified in such a manner as to facilitate the production of a test pattern.

Specifically, in step S15, the registers which are in the state most likely to satisfy but fail to satisfy the test conditions are replaced with registers with set function or reset function to satisfy the test conditions. In the current case, the register 2 is replaced with the register 2" with reset function. Also, the registers, to which a signal changing in output or expectation depending on the absence or presence of a fault is set and input, are replaced with scan registers. In the current case, the register 10 is replaced with the scan register 10'.

At the same time, the test data output terminal TDO for observing the scan data and the test clock input terminal TCK to which the test clock is input for setting and inputting, shifting and outputting the test data are added. The scan enable signal SE for setting the scan mode is added in the processor 104. The test data output terminal TDO is connected to the data output (Q) of the scan register 10' (generally, the last scan register of the scan chain). The signal line of the scan enable signal SE is connected to the scan enable input (SE) of the scan register 10'. The test clock input terminal TCK is connected to one input of the OR circuit 32. The other input of the OR circuit 32 is connected to the basic clock CK of the processor 104. The output of the OR circuit 32 is connected to the clock input (CK) of the scan register 10'.

In the current case, the test data input (TD) of the scan register 10' (generally, the first scan register of the scan chain) is fixed to VDD, but may alternatively be fixed to GND. As another alternative, a test data input terminal TDI for setting and inputting the scan data is provided and connected to the test data input (TD) of the scan register 10'.

In the current case, there is only one undetected fault, and therefore the original circuit CO shown in FIG. 1 is modified to a circuit C2 shown in FIG. 6 through the procedure described above. In the case where there are a plurality of undetected faults, as many registers as the undetected faults are repeatedly replaced.

Next, in step S16, a test pattern capable of detecting an undetected fault [signal line: SA1] is produced by the modified circuit C2 shown in FIG. 6. Up to the time point T12 when the state most likely to meet the test conditions is reached, the simulation in step S11 is used as it is (as described in detail with reference to FIG. 8 later). In this state, the following conditions are maintained.

Output signal line 15 of register 1 "1"
Output signal line 16 of register 2" "1"
Output signal line 17 of register 3 "1"
Output signal line 18 of register 4 "1"

From this state, the reset signal RESET is turned on to thereby produce a test pattern capable of detecting an undetected fault [signal line 16: SA1]. In the current case, the produced pattern is given as Output signal line 15 of register 1 "1"
Output signal line 16 of register 2" "0"
Output signal line 17 of register 3 "1"
Output signal line 18 of register 4 "1"

In the case where there are a plurality of undetected faults, the pattern production process described above is repeated.

Figure 8:
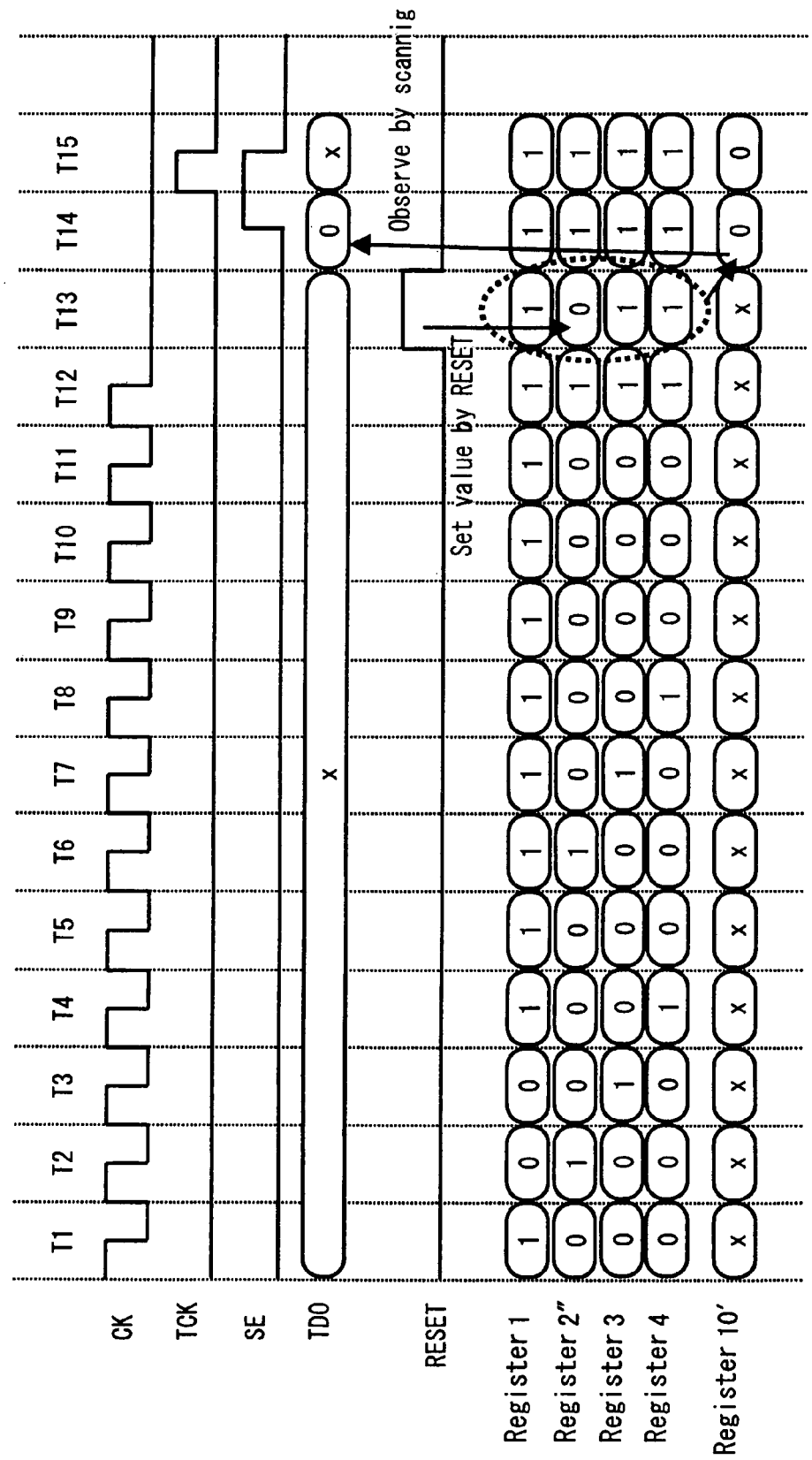
FIG. 8 is a time chart for explaining the operation of the modified circuit according to the second embodiment.

FIG. 8 is a time chart for explaining the operation of the modified circuit C2 shown in FIG. 6.

The fault simulation is carried out during the time period from T1 to T12 in the normal operation mode not involving the scan operation. During the period from T1 to T12, the test clock input terminal TCK is "0". Also, the scan enable signal SE is "0". The registers 1 to 4 (of which the register 2 has a set function) and the scan register 10' progressively change the values thereof in the same manner as in the fault simulation.

Figure 10:
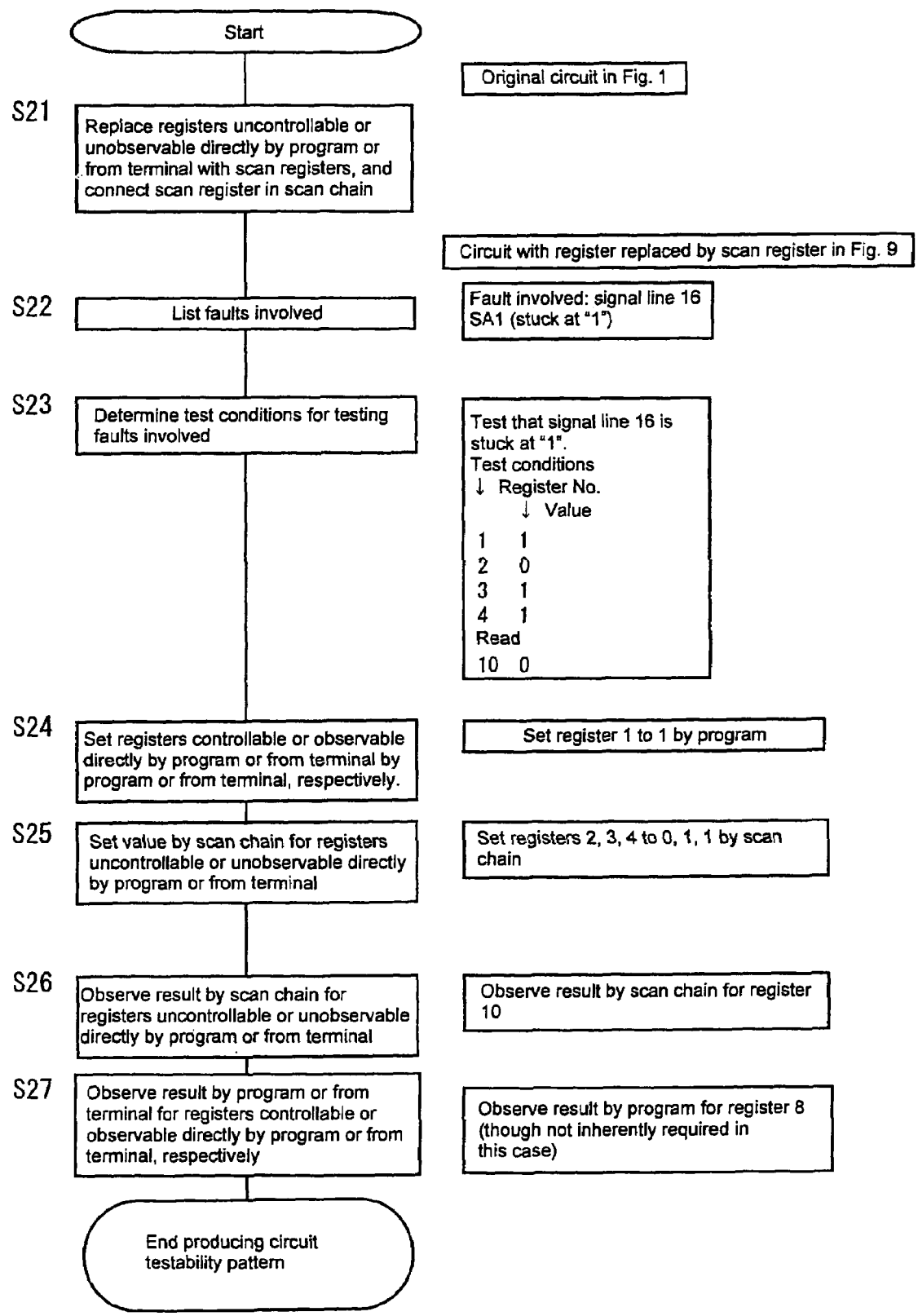
FIG. 10 is a flowchart showing the test operation including the production of a modified circuit and the production of a test pattern according to the third embodiment.

At the time point T12, the registers 1 to 4 assume a state most likely to meet the test conditions in the test design flow of FIG. 10. At time point T13, the basic clock CK is stopped and the reset signal RESET is turned on, so that the value of the register 2" with reset function is rewritten to thereby produce test conditions. Thus, the following test pattern is produced.

Output signal line 15 of register 1 "1"
Output signal line 16 of register 2" "0"
Output signal line 17 of register 3 "1"
Output signal line 18 of register 4 "1"

In order to fetch in the output of the AND circuit 29 under the test conditions into the scan register 10', the scan enable signal SE is set to "1" in the last half of time point T14. At time point T15, the test clock input terminal TCK is activated once to thereby fetch in the output of the AND circuit 29 into the scan register 10'. In the current case the scan chain includes only the scan register 10'. The value of the scan register 10' can be observed from the test data output terminal TDO. Alternatively, in the case where the scan chain has a plurality of registers, the scan enable signal SE is kept at "1" while the test clock input terminal TCK is activated. In this way, the values of the registers are sequentially observed from the test data output terminal TDO through the scan chain. In the current case, there is only one undetected fault and therefore the required test is ended.

In the case where there are a plurality of undetected faults, the test is repeated as many times as the number of the undetected faults.

This embodiment also represents a partial scan test. Only the required registers are replaced with the registers with reset function (or the registers with set function) and the scan registers. As compared to the full scan test method in which all the registers are replaced with the scan registers, therefore, the chip area is increased to a lesser degree.

Also, as in the first embodiment, the test conditions are produced taking advantage of the normal operating conditions (the operating conditions with the test pattern in step S11) under which the registers are operating in parallel, while at the same time reducing the length of the scan chain to the required minimum. In this way, the undetected faults can be captured within a shorter test time.

(Embodiment 3)

Figure 9:
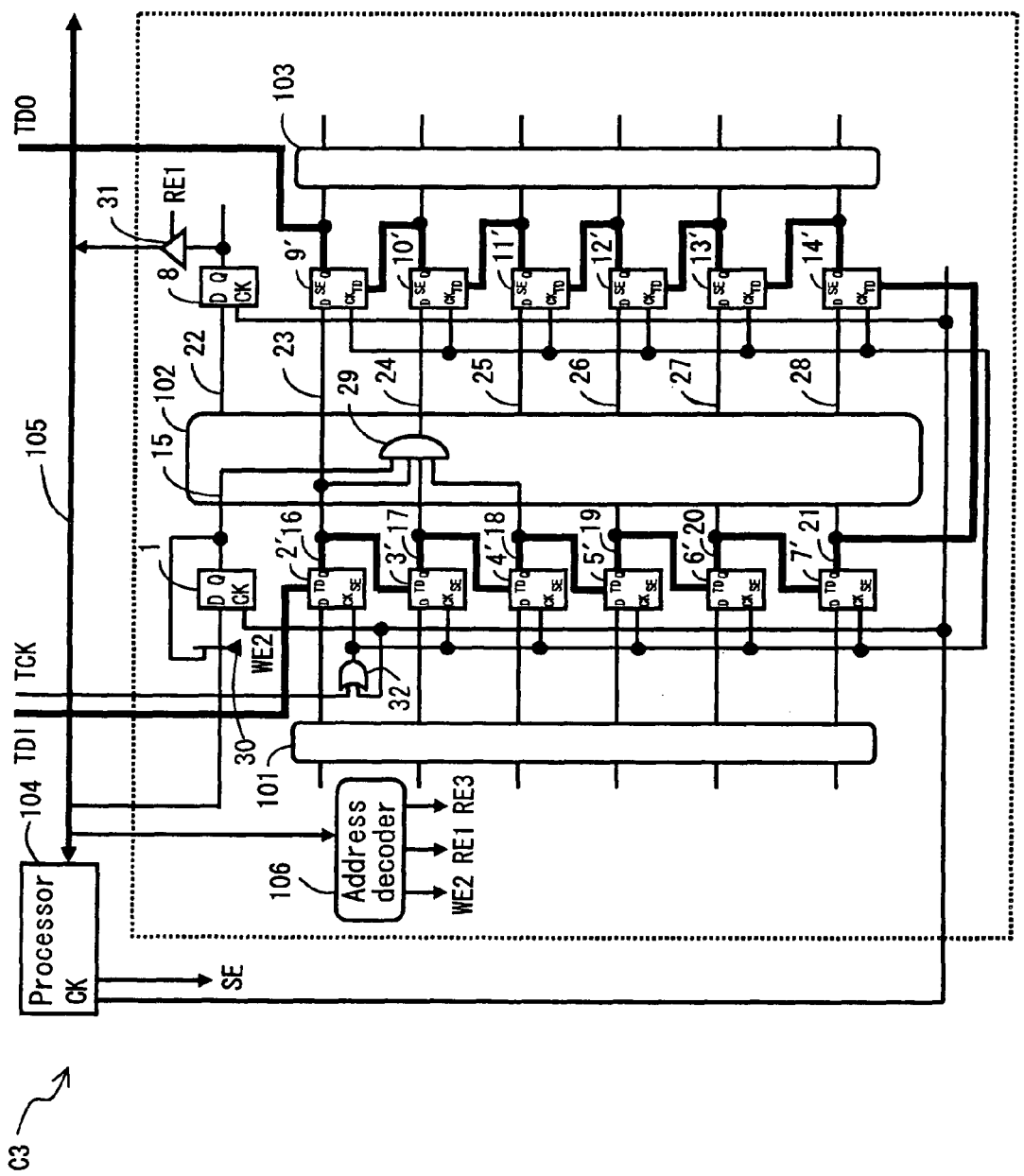
FIG. 9 is a circuit diagram showing a circuit modified from the original circuit for testability according to the third embodiment of the invention.

FIG. 9 shows a circuit C3 modified for testability from the original circuit CO of FIG. 1 not yet designed for testability. In the original circuit C0, the data can be set and input to the register 1 from the processor 104, and the register 8 can read the particular data from the processor 104. The registers other than the aforementioned two registers 1 and 8 are replaced with the scan registers to make up the modified circuit C3 shown in FIG. 9. Specifically, the registers 2 to 7 and 9 to 14 in the original circuit C0 are replaced with the scan registers 2'to 7' and 9' to 14', respectively (the method is explained later with reference to FIGS. 10 and 11). The scan registers 2' to 7' and 14' to 9' make up a scan chain. The data output (Q) of each scan register is connected to the test data input (TD) of the scan register in the next stage.

The test data input terminal TDI is connected to the test data input (TD) of the scan register 2' in the first stage of the scan chain. The test data output terminal TDO is connected to the data output (Q) of the scan register 9' in the last stage of the scan chain. The basic clock CK from the processor 104 and the signal from an external test clock input terminal TCK are applied to two input terminals of the OR circuit 32, the output of which is connected to the clock input (CK) of each of the scan registers 2' to 7' and the scan registers 9' to 14' making up the scan chain. The signal line of the scan enable signal SE from the processor 104 is connected to the scan enable input (SE) of each of the scan registers 2' to 7' and 9' to 14'.

In the modified circuit C3, a scan chain is configured of the scan registers 2' to 7' and 14' to 9' with which the registers are replaced and the test data input terminal TDI and the test data output terminal TDO connected thereto. In testing this scan chain, the processor 104 stops the output of the basic clock CK, while at the same time switching the scan enable signal SE to active "1". As a result, the scan registers 2' to 7' and 14' to 9' switch the data input terminal from the data input (D) for normal operation to the test data input (TD). An external test clock is input from the test clock input terminal TCK. This test clock is supplied to the clock input (CK) of each of the scan registers 2' to 7' and 14' to 9' through the OR circuit 32. Thus, an arbitrary test data from an external source is set and input to the test data input (TD) of the scan register 2' in the first stage by way of the test clock input terminal TCK, and can be shifted sequentially to the scan registers in the subsequent stages. With the desired test data set and input to the scan registers 2' to 7', the capture operation is performed. Thus, the data produced from the data output (Q) of each of the scan registers 2' to 7' are logically synthesized by the combination logic circuit 102. The result of this logic synthesis is set and input to the data input terminal (D) of each of the scan registers 9' to 14'. The scan operation is performed again, so that the data of the scan register 14' is shifted to the scan register 13', and the data of the scan register 13' is shifted to the scan register 12', and so forth. In this way, the data of the scan register 10' is shifted to the scan register 9'. Further, the data is output to an external test data output terminal TDO from the data output (Q) of the scan register 9'. In other words, the logic synthesis by the combination logic circuit 102 can be observed.

FIG. 10 is a flowchart showing the operation of correcting the original circuit C0 shown in FIG. 1 to the modified circuit C3 shown in FIG. 9 and producing a test pattern of the modified circuit C3. According to this embodiment, unlike the design for testability in the first and second embodiments, there exists no pattern for the original circuit C0, and the test pattern is produced in the state of FIG. 9.

First, in step S21, the registers in the original circuit CO, to which the data cannot be set and input directly or from which the data cannot be directly read, are replaced with scan registers. In the current case, the registers 2 to 7 and 9 to 14 are replaced with scan registers.

At the same time, the test data input terminal TDI is added for setting and inputting the test data for the scan operation. Also, the test data output terminal TDO is added for observing the scan data. Further, the test clock input terminal TCK is added for inputting the test clock to set and input, shift and output the test data. Also, in the processor 104, the scan enable signal SE is added for setting the scan mode. The test data input TDI is connected to the test data input (TD) of the scan register 2' making up the first stage of the scan chain. The test data output terminal TDO is connected to the data output (Q) of the scan register 9' making up the last stage of the scan chain. The scan enable signal SE is connected to the scan enable input (SE) of each of the scan registers 2' to 7' and 14' to 9'. The test clock input terminal TCK is connected to one of the inputs of the OR circuit 32. The other input of the OR circuit 332 is connected to the basic clock CK of the processor 104. The output of the OR circuit 32 is connected to the clock input (CK) of each of the scan registers 2' to 7' and 14' to 9'. In this way, the original circuit CO shown in FIG. 1 is modified to the modified circuit C3 shown in FIG. 9.

Next, in step S22, the faults involved are listed. In the current case, assume a fault SA1 in which the signal line 16 is stuck at "1". In the case where a plurality of faults occur, the operation of producing a pattern according to the concept and procedure described below is repeated as many times as the faults.

In step S23, the conditions for testing the faults involved are determined. In the current case, the signal lines for inputting and outputting signals to the AND circuit 29 in the combination logic circuit 29 are considered. The input side of the AND circuit 29 is connected with the signal lines 15 to 18 connected to the output of the register 1, and the scan registers 2', 3' and 4', while the output side thereof is connected with the signal line 24 of the scan register 10'. The test conditions for testing that the signal line 16 is stuck at "1" are determined. The test conditions are as follows:

Output signal line 15 of register 1 "1"
Output signal line 16 of register 2' "0"
Output signal line 17 of register 3' "1"
Output signal line 18 of register 4' "1"

In step S24, the test data are set and input using a program to the registers to which the test data can be set and input through the operation of the processor 104 according to a program. Alternatively, with regard to the registers to which the test data can be set and input from the integrated circuit terminal, the test data are set and input using the particular integrated circuit terminal. In the current case, a pattern is used in which the test data are set and input to the register 1 according to a program.

Next, in step S25, a value is set and input by way of the scan chain to the registers for which the test data cannot be set by operating the processor 104 according to a program or by inputting the data from the integrated circuit terminal. In the current case, a pattern is used in which the test data are set and input to the scan registers 2', 3' and 4' by the scan chain. In this way, a pattern is formed meeting the test conditions.

In step S26, to observe the test result after meeting the test conditions the test data are observed by the scan chain for the registers of which the test data cannot be observed by operating the processor 104 according to a program or by outputting the data from the integrated circuit terminal. In the current case, the value of the scan register 10' is observed by the scan chain. In other words, the data are read from the data output terminal TDO after shifting to the scan register 9'.

Next, in step S27, the test data are observed using the program or the integrated circuit terminal, as the case may be, for the registers for which the test data can be observed by operating the processor 104 according to a program or the registers for which the test data can be observed by the output from the integrated circuit terminal. In the current case, though not inherently required, the value of the register 8 is observed, for example, by operating the processor 104 according to a program.

Figure 11:
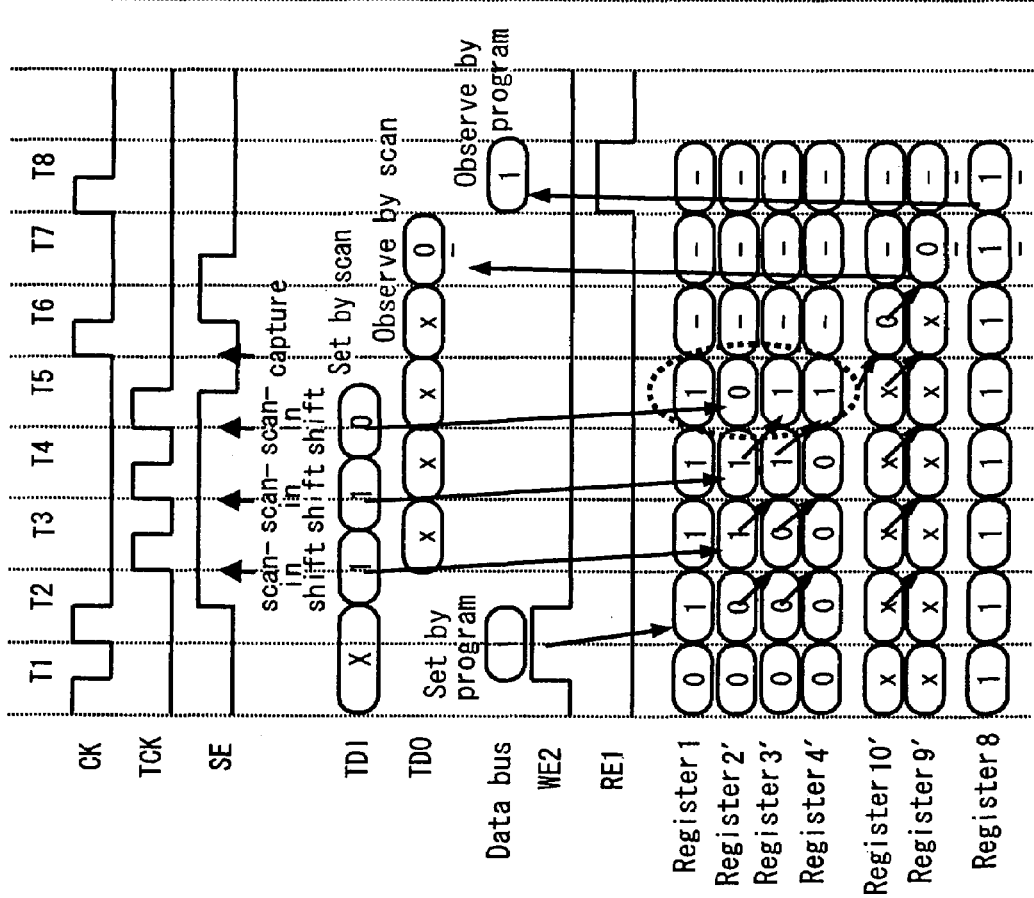
FIG. 11 is a time chart for explaining the operation of a modified circuit according to the third embodiment.
Figure 12:
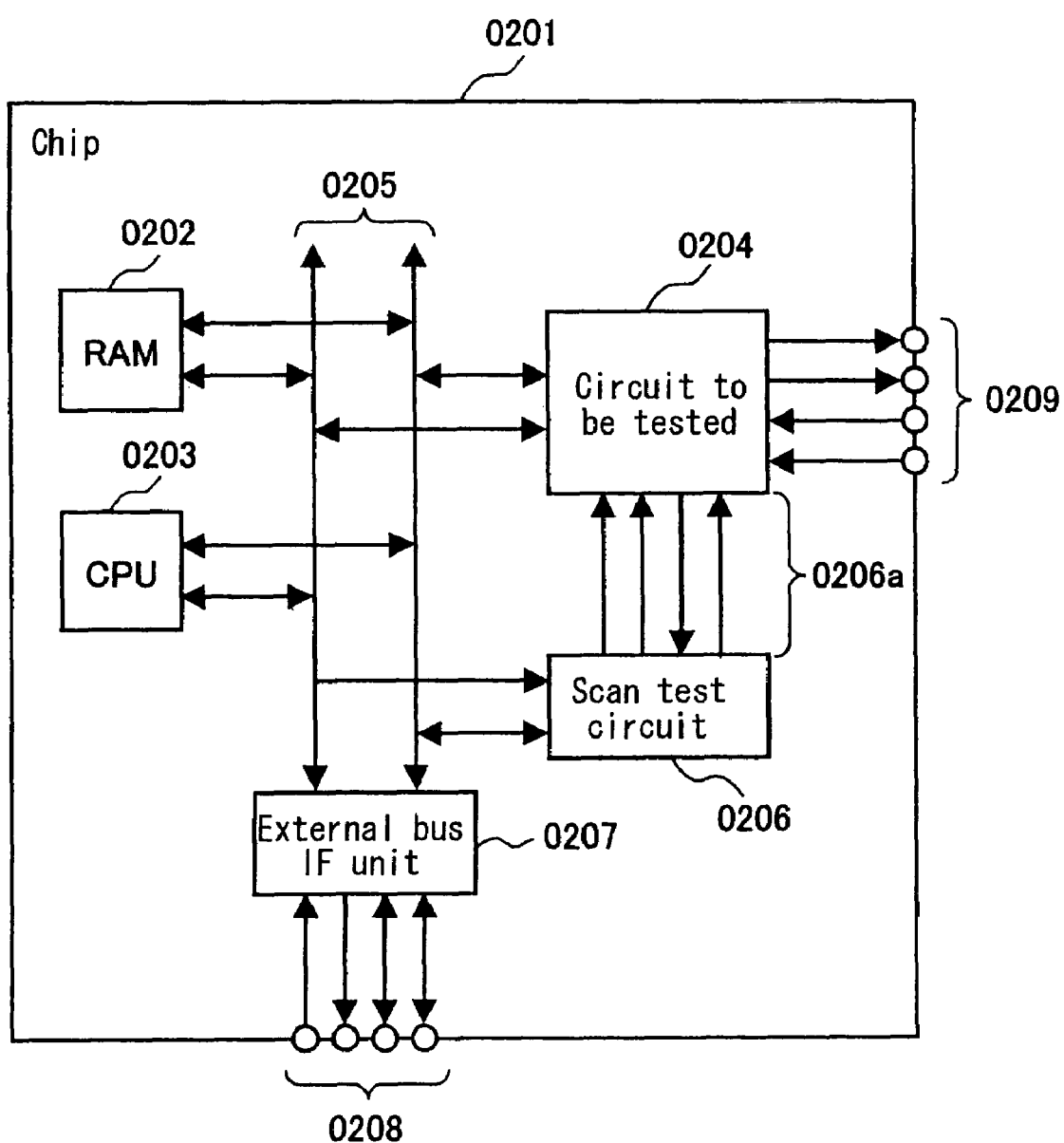
FIG. 12 is a diagram showing a configuration for the conventional method of testing the integrated circuit.

FIG. 11 is a time chart for explaining the operation of the modified circuit C3 shown in FIG. 9. FIG. 9 shows the elements, the write enable signal WE2 and the read enable signal RE1 identical to those in FIG. 5.

During the time period from T1 to T2, the test data are set and input to the registers controllable by a program or the integrated circuit terminal in normal operating mode, not in scan operation mode. In the current case, "1" is set and input to the register 1 by operating the processor 104. Specifically, at the time point T1, the processor 104 outputs to the bus 105 the address indicating the register 1 and the data "1" to be written in the register 1.

At the time point T2, the data "1" is written in the register 1 at the rise timing of the basic clock CK.

During the time period from T3 to T5, the scan operation is performed to set and input the test data to the scan registers 2', 3' and 4'. To perform the scan operation, the scan enable signal SE is set to "1" from the last half of the time point T2 and the basic clock CK from the processor 104 is stopped, while at the same time supplying the test clock from the test clock input terminal TCK.

From the last half of the time point T2, the test data input terminal TDI is set to "1". This is a value to be set and input finally to the scan register 4'.

At the time point T3, the value of the test data input terminal TDI is fetched into the scan register 2' at the rise timing of the test clock input terminal TCK.

From the last half of the time point T3, the test data input terminal TDI is set to "1". This is a value to be set and input finally to the scan register 3'.

At the time point T4, the value of the scan register 2' is fetched into the scan register 3' at the rise timing of the test clock input terminal TCK. Also, the value of the test data input terminal TDI is fetched into the scan register 2'.

From the last half of the time point T4, the test data input terminal TDI is set to "0". This is a value to be set and input finally to the scan register 2'.

At the time point T5, the value of the scan register 3' is fetched into the scan register 4' at the rise timing of the test clock input terminal TCK. Also, the value of the scan register 2' is fetched into the scan register 3'. Further, the value of the test data input terminal TDI is fetched into the scan register 2'. The state at the time point T5 constitutes the test mode. In other words, the data "1", "0", "1" and "1" are set and input to the registers 1, 2', 3' and 4', respectively.

From the last half of the time point T5, the scan enable signal SE is set to "0".

At time point T6, the basic clock CK is activated once, and the output of the AND circuit 29 in the test mode is fetched into the scan register 10'. In order to read the value of the scan register 10' at the test data output terminal TDO through the scan chain, the scan enable signal SE is set to "1" from the last half of the time point T6.

At the time point T7, the test clock input terminal TCK is activated once, and the value of the scan register 10' is fetched into the scan register 9'. This value is output from the data output (Q) of the scan register 9' to the test data output terminal TDO and thus can be observed.

In the way described above, the fault SA1 with the signal line 16 stuck at "1" can be detected.

In the current case, though not inherently required, the register 8 can be observed by operating the processor 104 according to a program in such a manner that the scan enable signal SE is set to "0" from the last half of the time point T7, while at the same time placing the address indicating the register 8 on the address portion of the bus 105. At time point T8, the basic clock CK is activated so that the value of the register 8 is read and observed at the data portion of the bus 105.

As compared to the full scan test in which all the registers 1 to 14 are replaced by scan registers, this embodiment is such that the registers 1 and 8 that can be controlled and observed directly from the processor 104 are left as they are. On the other hand, only the registers 2 to 7 and 9 to 14 which cannot be directly controlled and observed are replaced with scan registers. As a result, the increase in chip area is suppressed.

Also, the test conditions are produced using the normal operating conditions (with the processor in operation) in which the registers operate in parallel, and the scan chain is shortened as far as possible. As a result, the undetected faults can be captured within a shorter time.

The three embodiments are described above. The first embodiment can be combined with the second embodiment, the second embodiment with the third embodiment, the first embodiment with the third embodiment, and the first embodiment with the second and third embodiments.

As described above, this invention is different from the conventional full scan test method in which all the registers are replaced with scan register. According to this invention, only the registers associated with undetected faults are replaced with scan registers. As an alternative, registers with set or reset function are replaced with scan registers. As another alternative, only the registers that cannot be controlled or observed directly from the built-in processor or the integrated circuit terminal are replaced with scan registers. The employment of this partial scan test method can reduce the number of registers to be replaced with scan registers as compared to the full scan test method. As a result, the chip area can be prevented from increasing. At the same time, a part of the tests can be conducted with normal basic clock, thereby enabling the fast processing.

A register with a set function or a reset function improves the controllability from the processor or the integrated circuit terminal.

From the above description, it will be apparent what the present invention provides.

What is claimed is:

1. A technique for testability of a semiconductor integrated circuit, comprising:

the first step of conducting a fault simulation for the semiconductor integrated circuit based on a set of predetermined test signals and corresponding test results, and discriminating a detectable fault and an undetectable fault from each other, the predetermined test signals being a set of output values from a plurality of registers at an input side of a test object in the semiconductor integrated circuit the second step of listing undetectable faults as undetected faults;

the third step of determining test signals for detecting the undetected faults;

the fourth step of determining test signals most likely to meet the test signals of the third step from among the set of predetermined test signals of the fault simulation of the first step;

the fifth step of replacing registers at the input side associated with the undetected faults of the second step with scan registers and connecting the scan registers in a scan chain thereby to construct a modified circuit; and the sixth step of conducting the fault simulation or a test by switching to the test signals determined in the fourth step at the timing corresponding to the undetected faults while using the predetermined test signals in the first step for the modified circuit.

2. A technique for testability of a semiconductor integrated circuit according to claim 1, wherein the fifth step includes the step of replacing the input-side registers associated with the undetected faults not by scan registers but by registers with set or reset function thereby to constitute a modified circuit.

3. A technique for testability of a semiconductor integrated circuit according to claim 1, wherein the fourth step is conducted by comparing each signal constituting the test signals of the third step to a corresponding signal constituting the predetermined test signals.

4. A technique for testability of a semiconductor integrated circuit according to claim 3, wherein the registers associated with the undetected faults are registers on the input side outputting a different signal from the corresponding signal constituting the predetermined signals.

5. A technique for testability of a semiconductor integrated circuit, wherein registers connected to a combination logic circuit constituting an object of a test in the semiconductor integrated circuit are classified into first registers that can be controlled and observed directly from a built-in processor, second registers that can be controlled and observed directly from a terminal of the semiconductor integrated circuit and third registers other than the first and second registers, the technique comprising:

the first step of replacing the third registers with scan registers and connecting the scan registers in a scan chain to thereby constitute a modified circuit;

the second step of setting and inputting test data to the first and second registers from selected one of the processor and the integrated circuit terminal;

the third step of setting and inputting test data to the third register with the shift operation through the scan chain;

the fourth step of performing a capture operation of the test data for the combination logic circuit;

the fifth step of outputting test result data from the third register with the shift operation through the scan chain; and the sixth step of outputting test result data from the first and second registers.

* * * * *